United States Patent [19]
Parodi et al.

[11] Patent Number: 5,798,140
[45] Date of Patent: Aug. 25, 1998

[54] OSCILLATORY CHUCK METHOD AND APPARATUS FOR COATING FLAT SUBSTRATES

[75] Inventors: Michael L. Parodi, Alamo, Calif.; Roy E. Hurtig, Anacortes, Wash.

[73] Assignee: Semiconductor Systems, Inc., Fremont, Calif.

[21] Appl. No.: 640,248

[22] Filed: Apr. 30, 1996

Related U.S. Application Data

[63] Continuation of Ser. No. 152,036, Nov. 12, 1993, abandoned.

[51] Int. Cl.$^6$ ........................................ B05D 3/12
[52] U.S. Cl. .................... 427/240; 427/345.5; 427/346; 118/52; 118/54
[58] Field of Search .............................. 427/240, 38.5, 427/346; 118/52, 54

[56] References Cited

U.S. PATENT DOCUMENTS

| B 505,582 | 3/1976 | Shipman | 318/119 |
|---|---|---|---|
| 4,124,411 | 11/1978 | Meuleman | 118/53 |
| 4,271,209 | 6/1981 | DePalma et al. | 427/240 |
| 4,806,504 | 2/1989 | Cleeves | 427/240 |
| 4,822,639 | 4/1989 | Fujii et al. | 427/240 |
| 5,095,848 | 3/1992 | Ikeno | 118/52 |
| 5,366,757 | 11/1994 | Lin | 427/240 |

FOREIGN PATENT DOCUMENTS

| 343 589 | 11/1989 | European Pat. Off. |
| 2 169 768 | 10/1972 | France . |
| 60-074624 | 4/1985 | Japan . |
| 61-236543 | 10/1986 | Japan . |
| 63-100972 | 5/1988 | Japan . |

*Primary Examiner*—Janyce Bell
*Attorney, Agent, or Firm*—Skjerven, Morrill, MacPherson, Franklin & Friel; David E. Steuber

[57] ABSTRACT

An apparatus and method are provided for efficiently and effectively coating a substantially flat surface, i.e., a substrate, with a high-viscosity liquid chemical, such as photoresist. The flat surface is oscillated by rotating the surface in one direction and then repeatedly reversing the direction of rotation of the surface. The chemical is spread by both the centrifugal force of the rotation of the surface and the tangential force of the angular acceleration of the surface. The tangential force helps spread the chemical without prematurely overcoming the surface tension of the chemical resulting in a particularly effective coating using substantially less chemical. Chemical is alternatively spread by vibrating the flat surface. Vibrating applies to the chemical, in addition to radial, centrifugal force, if any, non-radial forces which are not directly opposed by surface tension. The chemical is therefore spread more evenly and efficiently without overcoming the surface tension of the chemical. Vibrating is accomplished either (i) by oscillating the surface with a low amplitude and a high frequency or (ii) by quickly moving the surface in a small, circular motion.

6 Claims, 6 Drawing Sheets

OSCILLATORY CHUCK METHOD AND APPARATUS FOR COATING FLAT SUBSTRATES

This application is a continuation of application Ser. No. 08/152.036, filed Nov. 12, 1993, now abandoned.

BACKGROUND OF THE INVENTION

1. Field of the Invention

The present invention relates to thin-film coatings of flat substrates such as semiconductor wafers and flat panel displays, and in particular to spin coating large surfaces with photoresist and similar high-viscosity chemicals.

2. Description of the Related Art

In the fabrication of semiconductors, a wafer is coated with photoresist or a similar high-viscosity liquid chemical by spinning the wafer and applying an amount of the liquid chemical to the center of the spinning wafer. (As used herein, the term "liquid" is not limited to fluids of low-viscosity and, in fact, can refer to highly viscous chemical substances.) Until recently, spin coating has been mostly confined to coating circular surfaces or small square mask plates. However, spin coating is now used to apply chemicals to thin film heads, multi-chip modules, and flat panel displays which are square or rectangular and are often very large. Spin coating such surfaces presents primarily two problems.

First, the corners of a square or rectangular surface are poorly covered. The chemical being applied to the surface is spun to the edge where excess is thrown from the surface by centrifugal force. Chemical leaving the center of an edge is struck by the corner of the spinning surface as the corner is further from the center of the surface than is the center of an edge. Such a collision disrupts the even flow of chemical from the center of the surface to the corners of the surface.

Secondly, spin coating larger surfaces results in striations in the chemical coating toward the edges and corners of the surface as a result of uneven drying of the chemical. To cover a large surface before the chemical dries, the chemical is applied to a surface spinning at a normal speed and the speed of the spinning surface is then ramped up, i.e., gradually increased, as the chemical spreads. Increasing the spin rate spreads the chemical more quickly and potentially before the chemical thickens substantially.

The surface tension of the chemical on the spinning surface is what causes the chemical to spread evenly during spinning. However, as the spinning rate is increased, the centrifugal force overcomes the surface tension of the chemical. This is especially true on larger surfaces such as large flat panel displays or when small volumes of chemical are used. When the surface tension is overcome, the smooth circular shape of the spreading chemical bursts like a bubble and the chemical then streams linearly toward the edges of the spinning surface in multiple radial paths. These multiple radial paths contribute to the formation of striations in the coating of the spinning surface.

The radial gaps in coating, i.e., the gaps between the radial streams of chemical, are filled in by applying an excess of the chemical to the center of the spinning surface. Excess chemical is applied until radial flow of the chemical from the center of the surface, as a result of the extreme centrifugal force, fills in the uncoated area. Thus, the surface is coated by saturating the surface with chemical, most of which, i.e., 95% or more, is discarded as waste. Furthermore, the uniformity of the coating can be poor as a result of uneven coating when the surface is initially coated and uneven drying of the chemical coating.

Excessive use of photoresist chemical in particular is a significant problem in the art. Photoresist accounts for approximately 5% of the cost of materials for semiconductors and generally costs as much as $1,000 or more per gallon. Thus, excessive waste of photoresist significantly affects the cost of manufacturing semiconductor devices. Additionally, disposal of photoresist waste presents a substantial environmental burden on communities in which semiconductor devices are manufactured and on surrounding ecological systems. The problem is exacerbated when coating larger surfaces.

What is needed is a method and apparatus which efficiently and effectively coats a substantially flat surface with a chemical. A method and apparatus capable of efficiently and effectively coating large, rectangular, flat surfaces with chemical is also desirable.

SUMMARY OF THE DISCLOSURE

A large, flat surface such as a flat panel for a flat panel display is coated with a highly viscous liquid such as photoresist chemical, not by simply spinning the flat panel as is typically done in the prior art, but by oscillating the flat panel. The flat panel is oscillated by spinning the flat panel in one direction, then spinning the flat panel in the opposite direction. The angular rotation of the flat panel in either direction is the amplitude of the oscillation. The inverse of the time elapsing during one full oscillation is the frequency of the oscillation.

The photoresist is spread by both the centrifugal force of the rotation of the flat panel and the tangential force of the angular acceleration of the flat panel. The tangential force helps spread the photoresist without prematurely overcoming the surface tension of the photoresist resulting in a particularly effective coating using substantially less photoresist.

DETAILED DESCRIPTION OF PREFERRED EMBODIMENTS

An apparatus and method are provided for effectively and efficiently coating a substantially flat substrate with a chemical such as photoresist. While photoresist is described herein as the chemical with which a substrate is coated, the principles described herein and recited in the claims below are equally applicable to coating substantially flat substrates with any other chemical. Furthermore, although large flat panels for flat panel displays are described as an illustrative example of a substantially flat substrate, any substrate, including thin-film heads, semiconductor wafers, and multi-chip modules, may be coated according to the principles set out below.

Figure 1:
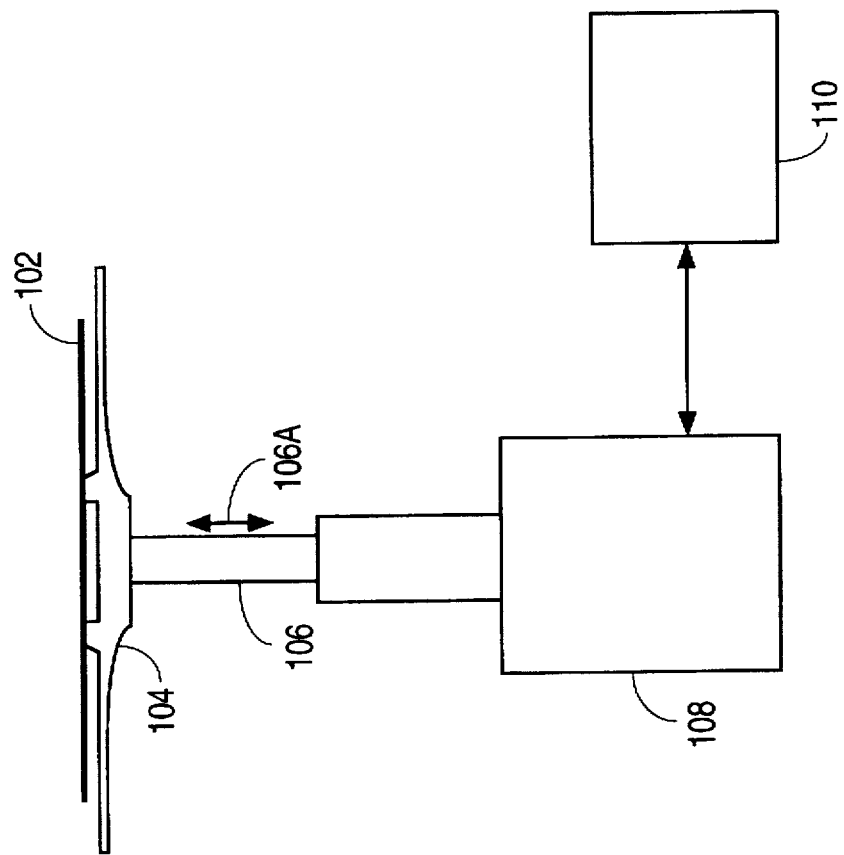
FIG. 1 is a schematic diagram of an oscillating chuck assembly according to the principles of the present invention.

A large, flat panel 102 (FIG. 1) is coated with a photoresist chemical (not shown), not by simply spinning flat panel 102 as is typically done in the prior art, but by oscillating flat panel 102. Flat panel is oscillated by spinning flat panel 102 in one direction and then spinning flat panel 102 in the opposite direction. The angular rotation of flat panel 102 in either direction is the amplitude of the oscillation. The inverse of the time elapsing during one full oscillation is the frequency of the oscillation.

Oscillating flat panel 102 applies to the photoresist, in addition to the centrifugal force resulting from the angular movement of flat panel 102, a tangential force resulting from the angular acceleration of flat panel 102. The tangential force aids in the spreading of photoresist to coat flat panel 102, but the tangential force does not directly oppose the force of surface tension and therefore does not overcome the surface tension of the photoresist spreading over flat panel 102. The result is that the spreading of the photoresist is less dependent on centrifugal force and less centrifugal force is used, i.e., the maximum rate of rotation of flat panel 102 is substantially less than rates typically used in the prior art.

Accordingly, the photoresist spreads over a greater portion of flat panel 102 before the centrifugal force overcomes the surface tension of the photoresist and streams in radial paths to the edge of flat panel 102. By appropriate selection of the amplitude and the frequency of the oscillations of flat panel 102, the entire surface of flat panel 102 can be coated smoothly, i.e., without striations, and efficiently, i.e., requiring substantially less photoresist than typically required by systems of the prior art. For example, a 200 mm semiconductor wafer has been coated with photoresist to a thickness of 1.0–1.5 microns using only one (1) cubic centimeter of photoresist. By comparison, between five (5) and ten (10) cubic centimeters of photoresist is typically used to coat the same size substrate using prior art methods.

Figure 2:
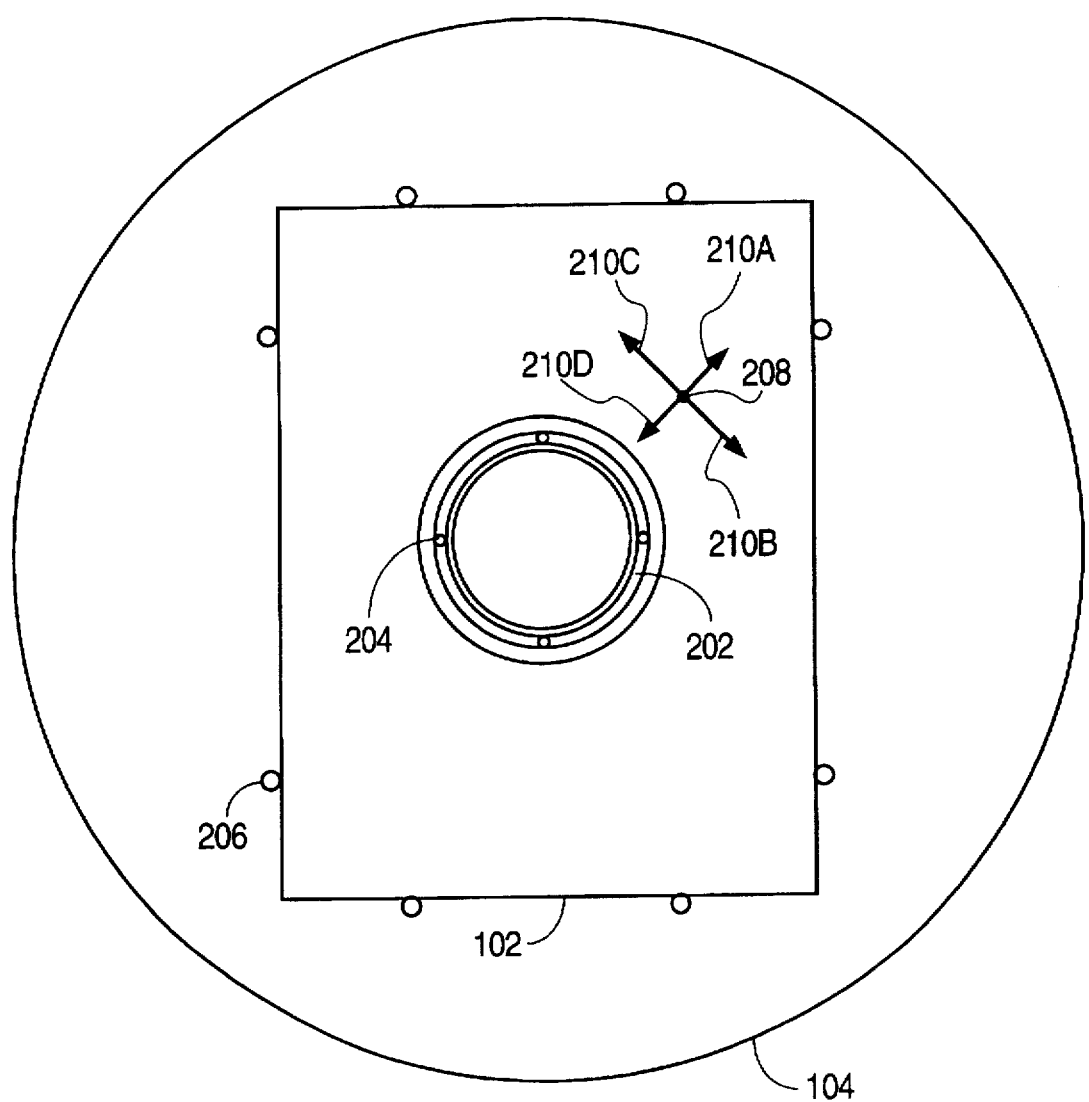
FIG. 2 is a plan view of an oscillating chuck and flat panel.

Flat panel 102 (FIG. 1) is held on a chuck 104 by a relative vacuum applied to the underside or "backside" of flat panel 102 at points at which chuck 104 contacts the backside of flat panel 102. In the portion of chuck 104 in contact with flat panel 102 is an annular groove 202 (FIG. 2). One or more vacuum ports 204 are drilled through chuck 104 to connect with annular groove 202. A relative vacuum applied to vacuum ports 204 results in a relative vacuum in annular groove 202 to firmly hold flat panel 102 to chuck 104. The application of a relative vacuum to the backside of a flat panel is well-known in the art and is not described herein. The System 500 system available from Semiconductor Systems, Inc. of Fremont, Calif. uses such a vacuum hold down. Safety posts 206 are positioned around the periphery of flat panel 102 for the safety of operators during the oscillation of chuck 104 and flat panel 102.

Chuck 104 (FIG. 1) is mounted on a shaft 106 which is moveable in the vertical direction as indicated by arrow 106A and whose rotation is controlled by a motor servo system 108. Motor servo system 108 is controlled by a control processor 110. In one embodiment, motor servo system 108 is a brushless DC servo controlled motor, and such motor servo systems are commonly known and used in the art. For example, the QMC Quality Motion Control motor and servo, which are available from QMC of Ulm, Minn. are used in one embodiment of the present invention. Furthermore, the control of motor servo system 108 by control processor 110 is well known in the art.

Control processor 110 is used to control the two most critical characteristics of the oscillation of chuck 104: the amplitude and the frequency. Chuck 104 (FIG. 3) is oscillated by causing motor servo system 108 (FIG. 1) to rotate chuck 104 (FIG. 3) such that a point on the edge of chuck 104 moves from position 302 to position 304. The direction of chuck 104 is reversed by motor servo system 108 (FIG. 1) such that the point of chuck 104 (FIG. 3) is moved from position 304 to position 302. The direction of rotation of chuck 104 is repeatedly reversed, resulting in an oscillating movement of chuck 104. The amplitude and frequency of the oscillation of chuck 104 are shown in FIG. 4.

Figure 4:
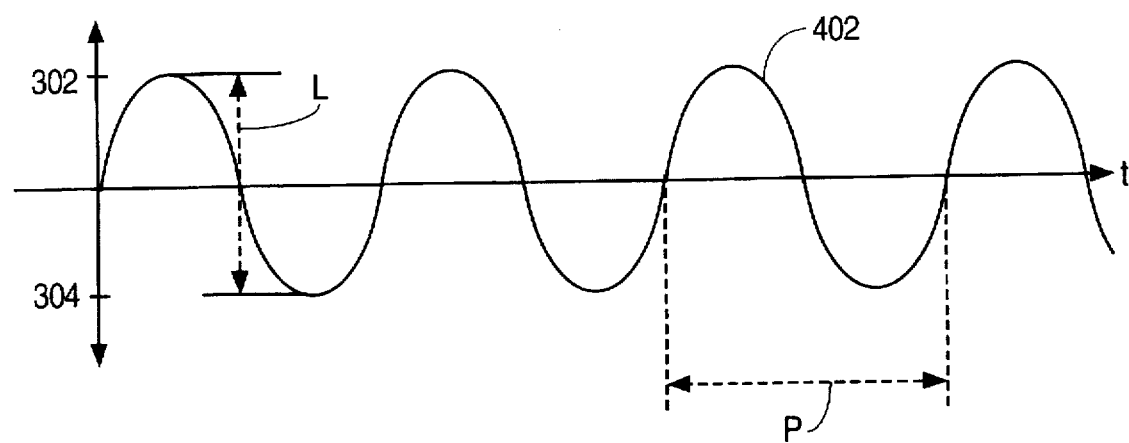
FIG. 4 is a graph of the oscillation of the chuck of FIG. 3.
Figure 3:
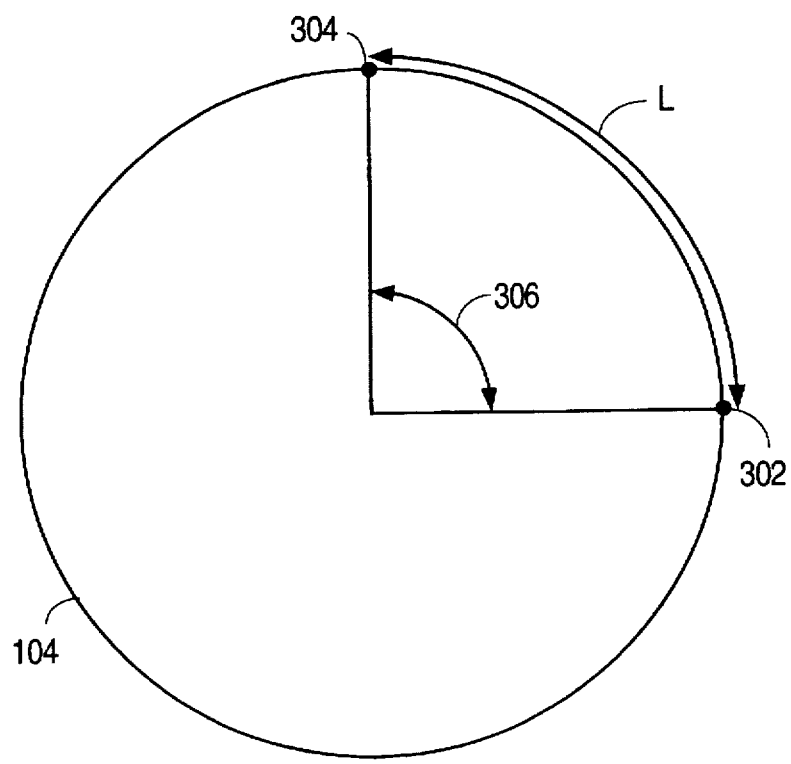
FIG. 3 illustrates the oscillation of the chuck of FIGS. 1 and 2.

The oscillation of chuck 104 is shown by a curve 402 (FIG. 4). The distance between positions 302 and 304, i.e., distance L (FIGS. 3 and 4), is the amplitude of curve 402 and therefore of the oscillation of chuck 104. The amplitude of the oscillation of chuck 104 is alternatively expressed as a maximum angle of rotation of chuck 104, i.e., expressed in terms of angle 306 (FIG. 3). Period P of curve 402 is the inverse of the frequency of curve 402 and therefore of the oscillation of chuck 104. In other words, the frequency of the oscillation of chuck 104 is $P^{-1}$. When the amplitude of the oscillation is low, i.e., less than fifteen (15) degrees, and the frequency of the oscillation is high, i.e., over twenty (20) cycles per second, the oscillation of chuck 104 is alternatively called "vibrating" chuck 104.

Centrifugal force resulting from the angular movement of chuck 104 applied to photoresist at a position 208 on flat panel 102 (FIG. 2) is force represented by arrow 210A. In addition, tangential force resulting from angular acceleration of chuck 104 applied to photoresist at position 208 is represented by arrows 210B and 210C. As surface tension, represented by arrow 210D, generally directly opposes centrifugal force, a radial force in the direction of arrow 210A and opposite arrow 210D, centrifugal force will tend to overcome surface tension relatively quickly.

Figure 5A:
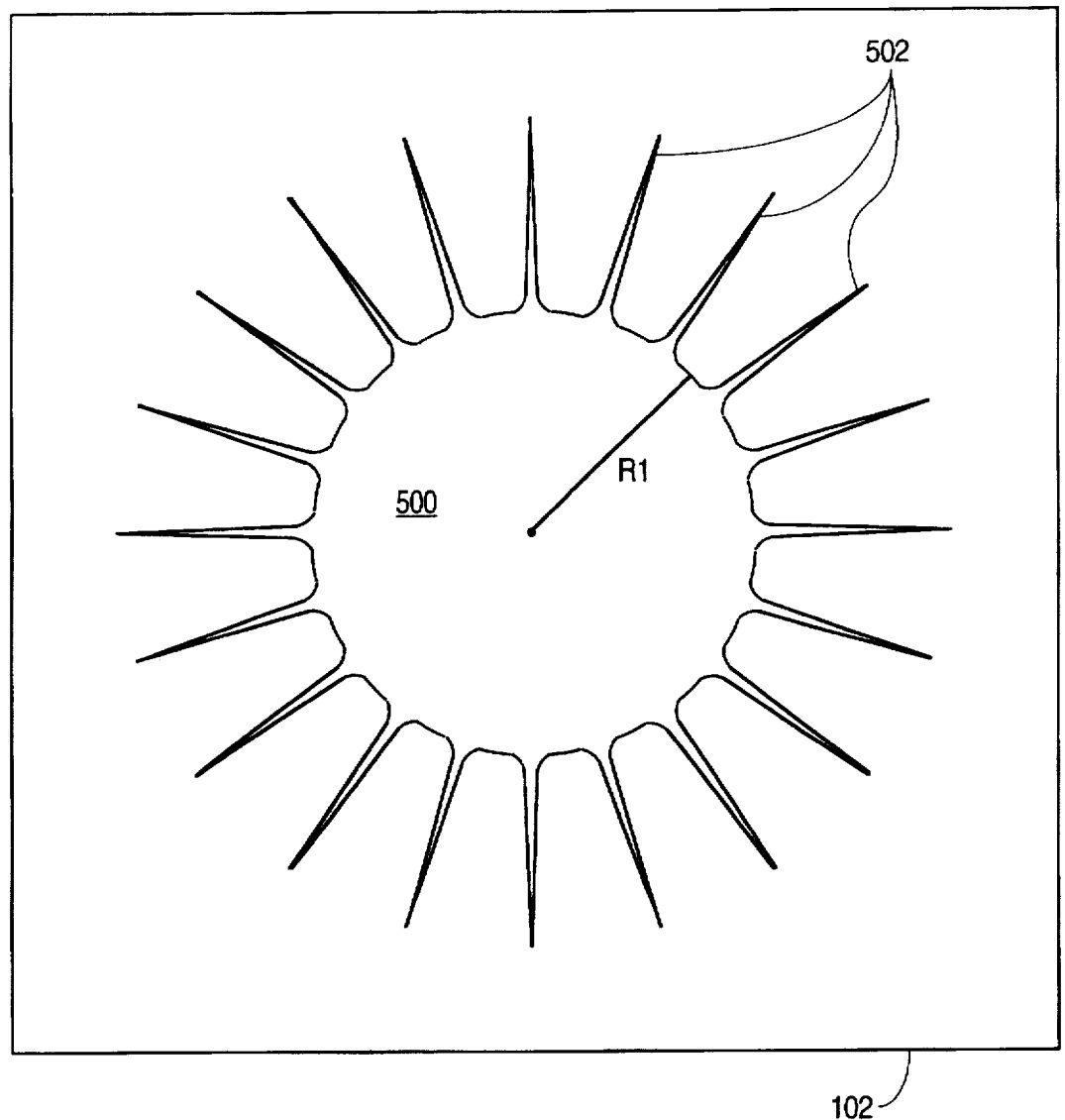
FIGS. 5A and 5B are plan views of photoresist which is spread over the flat panel of FIGS. 1 and 2.
Figure 5B:
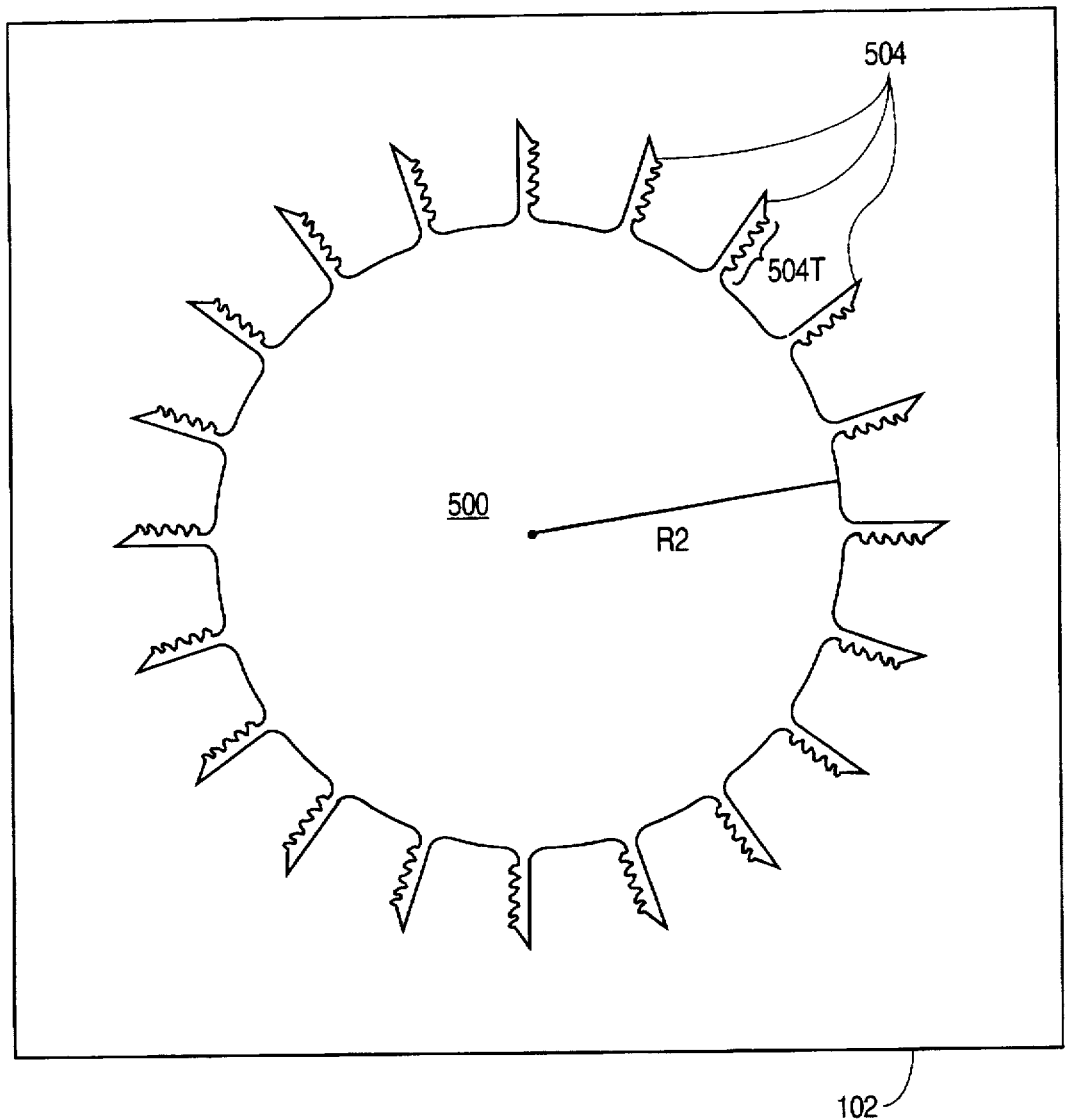

FIG. 5A illustrates the spreading of an amount of photoresist 500 in response to centrifugal force only, for example, when using the spin only techniques of the prior art. As shown in FIG. 5A, surface tension is overcome 35 by centrifugal force when photoresist 500 has a radius of R1. Thereafter, radial streams 502 form as a result of the centrifugal force. FIG. 5B illustrates the spreading of the same amount of photoresist 500 over flat panel 102 in response to centrifugal force and tangential force when using the oscillating chuck technique described herein. As shown in FIG. 5B, surface tension is overcome by centrifugal force when photoresist 500 has a radius of R2, which is substantially greater than radius R1 (FIG. 5A). In addition, when radial streams 504 (FIG. 5B) form from centrifugal force, fringes 504T form from tangential force thereby evidencing the presence of the tangential force.

The entirety of flat panel 102 can be coated without radial streams by proper selection of the amount of photoresist applied to flat panel 102 and of the amplitude and frequency of the oscillation of chuck 104 and flat panel 102. In one embodiment of the present invention, a circular wafer, which has a diameter of 200 mm, is coated with 1.5 microns of photoresist using only 1 cc of photoresist by oscillating the flat panel with an amplitude of ninety (90) to one hundred and eighty (180) degrees and a frequency of 10 cycles per second.

Figure 6A:
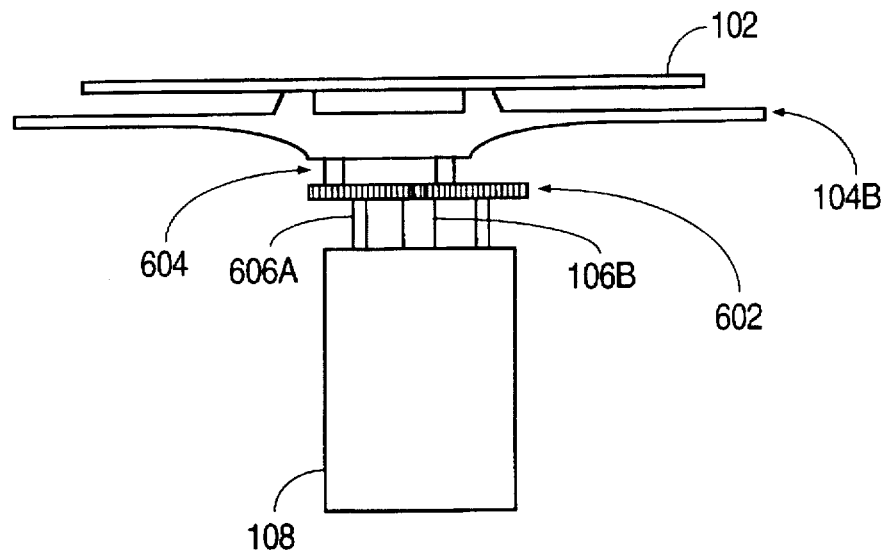
FIG. 6A is a schematic diagram of an orbital vibrating chuck assembly according to the principles of the present invention.
Figure 6B:
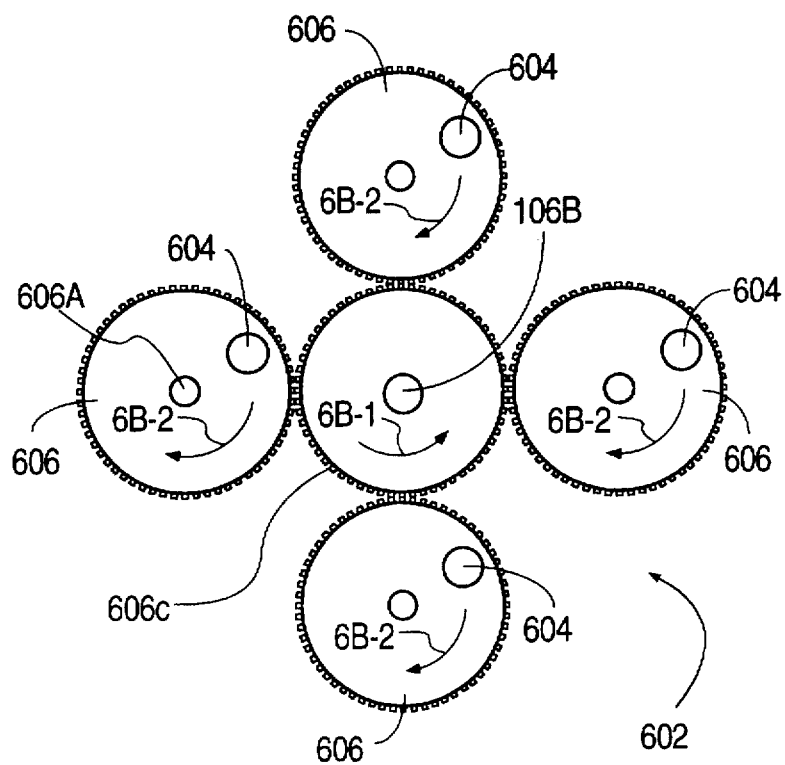
FIG. 6B is a plan view of the gear assembly of the orbital vibrating chuck assembly of FIG. 6A.

FIGS. 6A and 6B show a second embodiment of the present invention. Motor servo system 108 (FIG. 6A) turns shaft 106B which, in turn, turns a gear assembly 602. Gear assembly 602 is shown in greater detail in FIG. 6B. Shaft 106B turns a center gear 606C in the direction of arrow 6B-1. The rotation of center gear 606C in the direction of arrow 6B-1 turns gears 606 about respective axles 606A in the direction arrows 6B-2. Gears 606 are circular and axles 606A are fixed with respect to the position of motor servo system 108 (FIG. 6A). Each of axles 606A provides a center of rotation for a respective one of gears 606. Each of gears 606 includes a shaft 604 which is rotatably mounted between a non-central 35 position of a respective one of gears 606 and the underside of chuck 104B (FIG. 6A). Thus, chuck 104B is not oscillated, but is instead vibrated orbitally corresponding to the circular motion of shafts 604.

Orbital vibration of chuck 104B spreads photoresist (not shown) over the top surface of flat panel 102 without relying exclusively on radial, centrifugal force which is directly opposed by the surface tension of the photoresist. As a result, photoresist is spread without overcoming the surface tension of the photoresist as easily as do spin only coating methods of the prior art.

Many other methods for vibrating or shaking chuck 104 (FIG. 6A) are known. Many such methods apply non-radial forces or a combination of radial and non-radial forces to the surface of flat panel 102. As described above, when using non-radial forces to assist the spreading of photoresist over flat panel 102, surface tension is not as easily overcome and the surface is coated more efficiently and effectively than when only radial, centrifugal force is used. Thus, such known methods of vibrating or shaking chuck 104 which apply non-radial forces to the surface of flat panel 102 provide advantages in the coating of flat panels, and other substrates, with photoresist and other chemicals.

While specific embodiments are disclosed herein, the disclosed embodiments are illustrative only and are not to be limiting of the present invention. The present invention is therefore limited only by the claims which follow.

What is claimed is:

1. A method for applying a layer of a coating liquid to a surface of an article, the method comprising;

applying a quantity of the coating liquid to a portion of the surface; and oscillating the surface, until the coating liquid is evenly spread over the surface, wherein the step of oscillating comprises (a) spinning the article in a first direction for a first period of time and (b) spinning the article in a second direction, which is opposite the first direction, for a second period of time.

2. The method of claim 1 wherein the step of oscillating is performed at an amplitude of less than 15 degrees and a frequency of greater than 20 cycles per second.

3. The method of claim 1 wherein steps (a) and (b) are repeated.

4. A method for applying a layer of a coating liquid to a surface of an article, the method comprising:

applying a quantity of the coating liquid to a portion of the surface; and oscillating the surface to thereby spread the coating liquid over the surface, wherein the step of oscillating comprises (a) spinning the article in a first direction for a first period of time and (b) spinning the article in a second direction, which is opposite the first direction, for a second period of time and wherein the step of oscillating is performed at an amplitude of between 90 degrees and 180 degrees and a frequency of about 10 cycles per second.

5. A method for applying a layer of a coating liquid to a surface of an article, the method comprising:

applying a quantity of the liquid to the surface; and vibrating the article orbit ally, the surface of the article remaining substantially in the same plane.

6. An apparatus for applying a layer of a liquid to a surface of an article, the apparatus comprising:

a chuck which is capable of securely holding the article;

a central gear mounted on a vertical shaft;

a plurality of planetary gears rotatably mounted around and meshing with the central gear;

a connecting member joining a non-central point on each of the planetary gears with the chuck; and a motor for rotating the central gear to thereby vibrate the chuck orbitally.

* * * * *